(12) United States Patent
Callerant

(10) Patent No.: US 10,547,266 B2
(45) Date of Patent: Jan. 28, 2020

(54) MECHATRONIC ASSEMBLY CONTROLLED BY A PULSE-WIDTH MODULATION SIGNAL

(71) Applicant: MMT AG, Zug (CH)

(72) Inventor: Guillaume Callerant, Chavannes-sur-l'Etang (FR)

(73) Assignee: MMT AG, Zug (CH)

( * ) Notice: Subject to any disclaimer, the term of this patent is extended or adjusted under 35 U.S.C. 154(b) by 0 days.

(21) Appl. No.: 16/329,953

(22) PCT Filed: Aug. 23, 2017

(86) PCT No.: PCT/EP2017/071189
§ 371 (c)(1),
(2) Date: Mar. 1, 2019

(87) PCT Pub. No.: WO2018/041685
PCT Pub. Date: Mar. 8, 2018

(65) Prior Publication Data
US 2019/0199261 A1  Jun. 27, 2019

(30) Foreign Application Priority Data
Sep. 2, 2016  (FR) .................... 16 58199

(51) Int. Cl.
*H02P 23/14* (2006.01)
*H02P 25/03* (2016.01)
*H03K 3/037* (2006.01)

(52) U.S. Cl.
CPC ............. *H02P 23/14* (2013.01); *H02P 25/03* (2016.02); *H03K 3/037* (2013.01)

(58) Field of Classification Search
CPC .......... H02P 23/14; H02P 25/03; H02P 27/08; H02P 27/12; H02P 29/0016; H03K 3/037
See application file for complete search history.

(56) References Cited

U.S. PATENT DOCUMENTS

| | | | |
|---|---|---|---|
| 3,433,924 A | 3/1969 | Sevenco | |
| 5,489,831 A | 2/1996 | Harris | |
| 5,543,696 A * | 8/1996 | Huggett | H02P 6/06 318/590 |
| 9,684,285 B2 | 6/2017 | Rondot et al. | |
| 10,333,447 B2 * | 6/2019 | Price | H02P 6/10 |
| 2004/0135534 A1 * | 7/2004 | Cullen | G05B 17/02 318/609 |
| 2011/0115416 A1 * | 5/2011 | Oh | H02J 7/345 318/139 |
| 2015/0323908 A1 | 11/2015 | Rondot et al. | |
| 2016/0156294 A1 * | 6/2016 | Heo | H02P 6/182 318/400.34 |
| 2016/0369855 A1 * | 12/2016 | Essenmacher | F16D 48/064 |
| 2017/0331409 A1 | 11/2017 | Andrieux et al. | |

FOREIGN PATENT DOCUMENTS

GB           2013011 A    8/1979

\* cited by examiner

*Primary Examiner* — Thai T Dinh
(74) *Attorney, Agent, or Firm* — Harness, Dickey & Pierce, PLC

(57) ABSTRACT

The disclosure relates to a mechatronic assembly for driving a body, which is designed to be connected to a continuous electrical power source and an electronic control unit comprising a computer for running a power-assistance algorithm supplying a pulse-width modulation input signal having discrete states and a cyclic ratio encoding the steering and torque/speed information.

17 Claims, 7 Drawing Sheets

Fig. 7
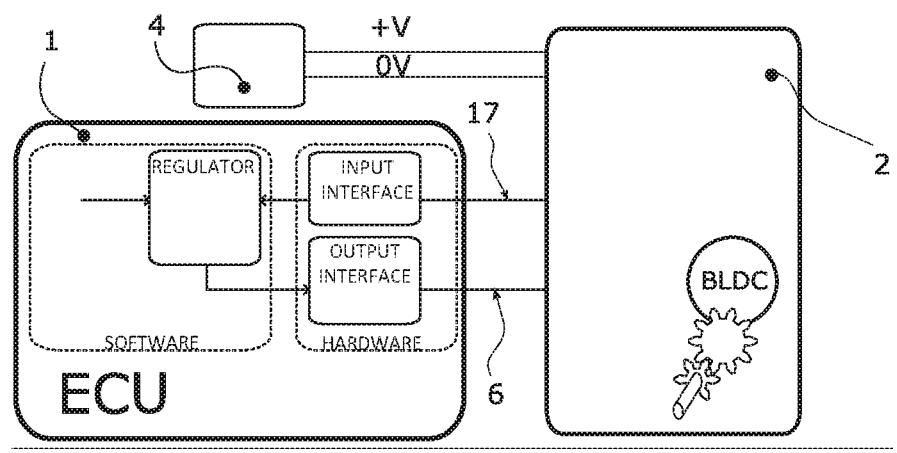
Fig. 8
Fig. 9
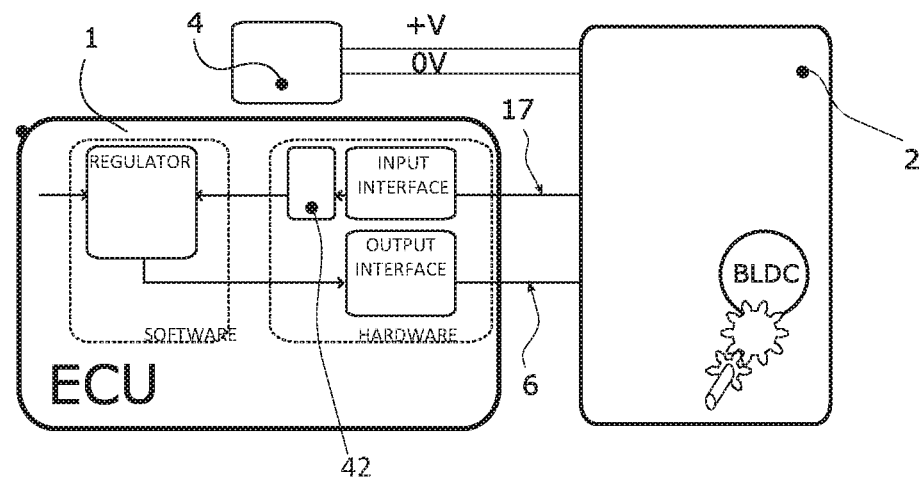

MECHATRONIC ASSEMBLY CONTROLLED BY A PULSE-WIDTH MODULATION SIGNAL

CROSS-REFERENCE TO RELATED APPLICATIONS

This application is a National Phase Entry of International Patent Application No. PCT/EP2017/071189, filed on Aug. 23, 2017, which claims priority to French Patent Application Serial No. 16/58199, filed on Sep. 2, 2016, both of which are incorporated by reference herein.

TECHNICAL FIELD

This invention relates to the area of mechatronic assemblies controlled in pulse width modulation, preferably used for, but not limited to, automotive applications such as, for example, the phase shift of the camshaft.

BACKGROUND

The prior art is known by the French patent application FR14/61241 describing a mechatronic unit for driving a member intended to be connected on the one hand to a DC power source and on the other hand to an ECU control unit comprising a computer for calculating a servo algorithm delivering steering and torque information, this unit comprising an actuator formed by an N-phase (where N>1) multiphase brushless electric motor, binary sensors for detecting the position of the rotor of said motor, an electronic circuit comprising a power bridge for supplying the N phases of the motor. This prior art unit further comprises an on-board electronic driver circuit free of microcontroller, computer and memory, the input of which receives this steering and torque information from the ECU and whose output controls said power bridge providing for the self-switching of the motor by combining the information from the steering and torque signal, binary probes for detecting the position of the rotor and a switching logic modulating directly the current of the continuous power source applied to each of said engine phases and in that the torque and steering information provided by the ECU is distinct from the power signal delivered only by the power source.

In the prior art, the international patent application WO2016079315A 1 also describes a mechatronic unit for driving a member intended to be connected on the one hand to a DC power source and on the other hand to an ECU control unit comprising a computer for performing a servo algorithm delivering steering and torque information, said unit comprising an actuator formed by a N-phase multiphased brushless electric motor, binary sensors for detecting the position of said motor rotor, an electronic circuit comprising a power bridge for supplying the N phases of the motor, characterized in that it further comprises an on-board electronic driver circuit whose input receives said steering and torque information from the ECU and whose output controls this power bridge directly modulating the current of the DC power source applied to each of said motor phases and in that the torque and steering information provided by the ECU is distinct from the output power signal delivered only by the power source. The torque information is information which makes it possible to adjust, at the output of the power bridge, the position or speed of the rotor of the loaded motor.

The patent application WO2014091152 from the prior art describes an actuator driven by a brushless DC motor, while keeping the existing elements identical to the system based on a DC motor with brushes. The actuator is connected to the control system through a connector gathering the analog and/or digital signals from the position sensor, as well as the signals combining the direction and the torque to be produced by the BLDC motor. A basic electronic circuit resistant to high temperatures (>125° C.) manages the self-switching of the N phases of the motor using N probes giving the position of the motor rotor. The objective of the solution described below is to provide a technological compromise making it possible to remedy the issues mentioned above and to offer a cost-effective solution requiring no microprocessor, enabling the use of a brushless DC motor instead of a DC motor with brushes, while keeping the possibility of using a reversible polyphase motor and controlling it in both directions of rotation. The invention is thus applicable to any N-phase polyphase motor. Other examples of such mechatronic assemblies are also described in patent applications WO95/08214 and GB2013011.

The problem with the prior art is that the maximum set point speed that can be sent by the control circuit without a computer is limited by the frequency of the direction and torque information (or speed information since a given supply voltage will fix, for a given load, the torque and speed) transmitted by the controller. This direction and torque/speed information is physically a pulse width modulated control signal called $PWM_{IN}$. The ECUs (Electronic Control Units) integrated in the vehicles have been designed to control electro-hydraulic valves requiring a low frequency of the control signal modulated in pulse width, in the range of 100 to a few hundred Hertz ($PWM_{IN}$<500 Hz). To obtain a sufficient rotational speed of the BLDC motor for the application, an obvious solution is to increase the frequency of the pulse-width modulated control signal, which implies a significant hardware modification of the controller.

In addition, the direction and speed information returned by the mechatronic assembly to the controller allowing the application to be controlled is transmitted via separate channels, which may lead to interpretation errors by the controller resulting from the lack of synchronism between the two signals, this risk evolving in proportion to the rotational speed of the associated BLDC motor and its electronic power bridge control module. This second problem is potentially related to the problem of the maximum speed limit, but also exists independently from this problem.

A third problem concerns the extreme values of the duty cycle of the pulse-width modulated control signal (close to the values of 0 or 100%) that cannot be generated by existing controllers. An PWM control requires the use of duty cycle ranges close to extreme values in order to detect electrical faults on the PWM control line. For example, faults associated with a line break, a permanent or intermittent short circuit of the line to ground or supply voltage are found. Therefore, these duty cycle ranges cannot be used for encoding direction and torque/speed information.

This results in the loss of part of the electrical power (typically 8%) that can be transmitted to the BLDC motor, the latter being the image of the PWM control signal. This third problem is potentially related to the problem of the maximum speed limit, but also exists independently from this problem.

SUMMARY

This invention concerns in its most general sense a mechatronic assembly for driving a component intended to be connected on the one hand to a continuous electrical power source and on the other hand to an electronic control unit comprising a computer for executing a servo algorithm delivering a pulse width modulation input signal having discrete states and a duty cycle encoding direction and torque/speed information, said assembly comprising a polyphase brushless electric motor with P phases (where P>1), binary detection probes of the position of the rotor of said motor, a power bridge for supplying the P phases of the motor, and an on-board electronic control circuit whose output controls said power bridge ensuring the self-switching of the motor by combining information from the direction and torque/speed signal, binary detection probes of the rotor position and a switching logic directly modulating the current of the continuous electrical power source applied to each of said motor phases, the direction and torque/speed information provided by the electronic control unit being distinct from the power signal provided only by the power source, characterized in that it includes a frequency multiplier placed upstream of the electronic control circuit and producing for each discrete state of said input signal $X^N$ discrete states of high frequency direction and torque/speed information having the same duty cycle as the discrete input state, of a duration $X^N$ times less than the duration of the discrete state of the input signal, where X and N are integers ≥1, and whose output frequency is greater than or equal to the electrical frequency of the space phasers of the controlled motor (8).

According to a preferred embodiment, the on-board electronic control circuit (10) is free of microcontroller, ECU and memory. For example, X is 2 and N may vary depending on engine speed. Preferably, said frequency multiplier (14) includes a phase-locked loop module and it can include a frequency multiplier electronic circuit composed of N elementary frequency multiplier modules allowing each stage to multiply the frequency of its input signal and to transmit said multiplied signal 26 to the on-board electronic control circuit.

In an alternative embodiment, said on-board electronic control circuit includes a modulation electronic circuit that generates a modulated unidirectional digital electrical signal with coded discrete states. Advantageously, said electronic modulation circuit encodes said modulated signal as a function of the direction of the motor and/or as a function of the rotational speed of the motor. In a particular embodiment, said electronic modulation circuit modulates the signal in pulse width and encodes the duty cycle of each discrete state.

In another embodiment, said electronic modulation circuit modulates the signal in amplitude and encodes the amplitude of the high level of each discrete state with a fixed duty cycle. In another embodiment, said electronic modulation circuit modulates the signal in frequency and codes the frequency. Advantageously said electronic modulation circuit codes the amplitude of the high level of each discrete state according to a first information, the duty cycle according to a second information and the frequency according to a third information. In a particular embodiment, said on-board electronic control circuit includes an impedance adapter that applies a voltage to each of the space phasers according to the spatial duty cycle.

$$R_{MOSFET} = R_6 \times \frac{100}{R_{6H} - R_{6L}} + \left(100 - \frac{100}{R_{6H} - R_{6L}} \times R_{6H}\right)$$

or R6 denotes the duty cycle of the control signal from the external controller, $R_{6H}$ denotes the upper limit of the duty cycle transmitted by the external controller, $R_{6L}$ denotes the lower limit of the duty cycle transmitted by the external controller. In another particular embodiment said on-board electronic control circuit includes an impedance adapter that applies a voltage to each of the spatial phasers according to the duty cycle $$R_{MOSFET} = -\left(R_6 \times \frac{100}{50 - R_{6L}}\right) + \left(100 + \frac{100}{50 - R_{6L}} \times R_{6L}\right)$$

when $R_6$ is less than 50% and $$R_{MOSFET} = R_6 \times \frac{100}{R_{6H} - 50} + \left(100 - \frac{100}{R_{6H} - 50} \times R_{6H}\right)$$

when $R_6$ is greater than or equal to 50%; or $R_6$ denotes the duty cycle of the control signal from the external controller, $R_{6H}$ denotes the upper limit of the duty cycle transmitted by the external controller, $R_{6L}$ denotes the lower limit of the duty cycle transmitted by the external controller. In these last previous embodiments, said ECU control unit determines a duty cycle $R_6$ less than $R_{6L}$ or greater than $R_{6H}$ to control a protection mode.

BRIEF DESCRIPTION OF THE DRAWINGS

The present invention will be better understood upon reading the following detailed description of a non limiting exemplary embodiment, while referring to the appended drawings, wherein:

FIGS. 6, 7 and 8 represent the principle diagram of the previous circuit according to three different embodiments;

FIG. 9 shows an example of modulation of the direction and speed information returned by the mechatronic assembly to the controller, allowing the application to be controlled;

DETAILED DESCRIPTION

Figure 1:
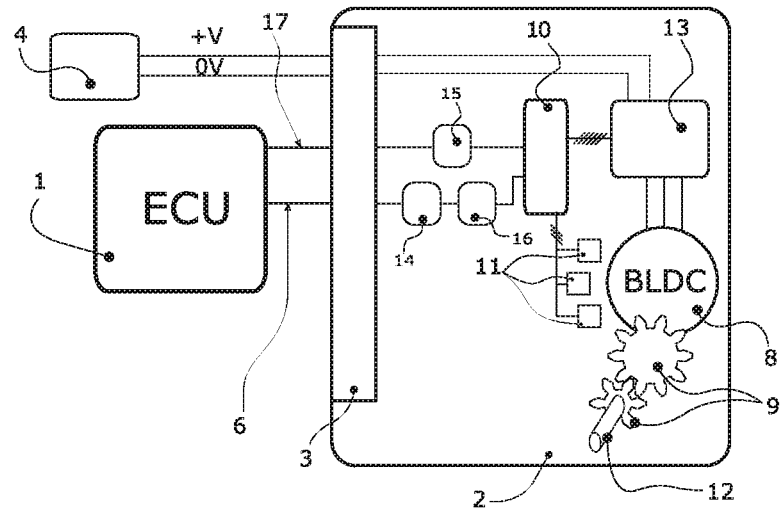
FIG. 1 schematically shows a mechatronic unit based on the invention as well as the elements needed for its control and supply.

FIG. 1 describes schematically a mechatronic unit according to the invention as well as the elements needed for its control and supply. It comprises an electronic control unit—ECU—(1), for example an automotive controller, the mechatronic unit (2) according to the invention, at least one connector (3), a source of continuous electrical power (4), for example an automobile battery, Hall probes (11), generally three in number when associated with a triphase motor, detecting the rotation of the brushless motor—or BLDC—(8) and intended to allow the self-switching of the phases of the motor, this electronic control unit (1) delivering a steering and torque/speed information (6) to an on-board electronic driver circuit (10). The power signal coming from the power source (4) is directly applied to the power bridge (13) containing generally 6 transistors to supply the 3 phases of the BLDC motor (8). The on-board electronic driver circuit (10) whose output controls said power bridge (13) providing for the self-switching of the motor (8) by combining the information from the steering and torque/speed signal (6), binary probes (11) for detecting the position of the rotor and a switching logic (not shown) modulating directly the current of the continuous power source (4) applied to each of said motor (8) phases, the torque/speed and steering information (6) provided by the ECU (1).

The mechatronic assembly is intended to move an external member via an output shaft (12) with or without the presence of a mechanical motion reduction assembly (9). As a non-limiting example, the device can be used to control the movement of a camshaft phase shifter.

The mechatronic assembly (2) can integrate a frequency multiplier (14) producing for each discrete state of the input signal $X^N$ discrete output states having the same duty cycle as the input discrete state, of a duration $X^N$ times less than the duration of the discrete state of the input signal, where X is an integer and where N is an integer $\geq 1$, and whose output frequency is greater than or equal to the electrical frequency of the space phasers of the controlled motor. This frequency multiplier (14) makes it possible to solve two problems of the solution proposed by the FR14/61241 patent:

A) The signal frequency of the direction and torque/speed information (6) ($PWM_{IN}$) signal must be higher than the electric frequency of the motor at its no-load speed multiplied by a factor of 6 in the case of a three-phase motor. This is to ensure that the energy will be constant in all engine space phasers.

B) The controllers (ECU—Electronic Control Unit) integrated in the vehicles have been designed to control electro-hydraulic valves, but this type of solution requires a low control frequency (100 Hz<$FPWM_{IN}$<1000 Hz). Today, the electrification of certain applications (camshaft phase shifter, or "eVCP") with direct drive or simplified installation technologies (e. g. the solution proposed by the FR14/61241 patent) requires higher control frequencies ($FPWM_{IN}$>15,000 Hz). The mechatronic assembly (2) can also integrate an electronic modulation circuit (15) modulating on a single physical medium in the form of a unidirectional digital electrical signal (17) the instantaneous direction (of rotation direction) and rotor speed information of the BLDG motor being returned by the mechatronic assembly (2) to the electronic control unit (1). The electronic modulation circuit (15) uses the speed information from the states of the digital Hall effect sensors (11) as well as the position information derived from the sequence of control signals produced by the control circuit (10) for generating the space phasers via the power bridge (13). This electronic modulation circuit (15) makes it possible to solve a problem of the solution proposed by the FR14/61241 patent.

C) The direction and speed information returned by the mechatronic assembly to the controller allowing the application to be controlled is transmitted via separate channels, which may lead to misinterpretation by the electronic control unit (1) resulting from the lack of synchronism between the two signals. The mechatronic assembly (2) can also include an impedance adapter (16) to optimize the energy transmitted by the power bridge (13) to the BLDG motor (8) through each of the 6 electrical phasers (space phasers) until the whole bridge is controlled, which is equivalent to applying a duty cycle to the power bridge of 100%. The impedance adapter (16) also allows the control law between the duty cycle of the direction and torque/speed information (6) and the duty cycle of the control signals of the power bridge transistors in the case of a voltage control to be modified. This impedance adapter (16) is used to solve a problem of the solution proposed by the FR14/61241 patent.

D) Some of the electrical power available at the power source (4) cannot be transmitted to the BLDG motor (8) via the power bridge (13).

Detailed Description of the Frequency Multiplier (14)

In FIG. 1, the proposed solution consists in the integration of a frequency multiplier (14) allowing the use of adirection and torque/speed information (6) in low frequencies coupled to any motor control solution made by hardware BLDCs without ECU, software or memory. The electronic control unit (1) provides direction and torque/speed information (6) to a frequency multiplier electronic circuit (14) storing the direction and torque/speed information that it transmits to the on-board electronic control circuit (10) at a higher frequency than that of the signal (6). The power signal coming from the power source (4) is directly applied to the power bridge (13) containing generally 6 transistors to supply the 3 phases of the BLDC motor (8).

Figure 2:
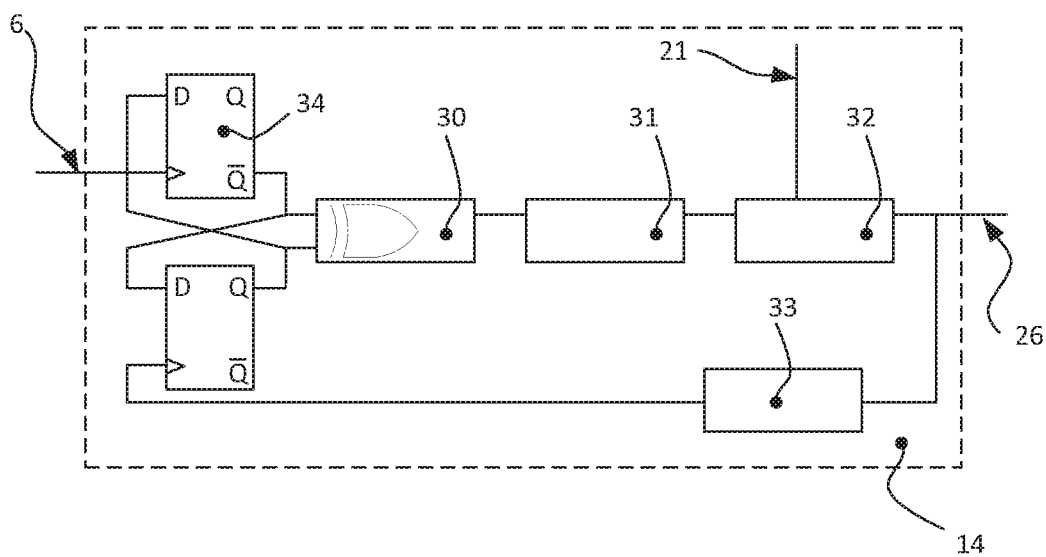
FIG. 2 shows the block diagram of an example of architecture of a frequency multiplier.

FIG. 2 shows a first solution for realizing the frequency multiplier (14), using the phase locked loop (PLL) which when locked, generates a high-frequency steering and torque/speed information signal (26) equal to the steering and torque/speed information signal (6) multiplied by a factor X and preferably consisting, but not limited to, a phase comparator (30) (Phase Frequency Detector—PFD) which can be realized with an OR EXCLUSIVE logic gate (XOR), a loop filter (31) with or without load pump module, an oscillator (32) (Voltage Controlled Oscillator—VCO) controlled by a control voltage (21), a frequency divider (33), a system (34) for symmetrizing the input signals of the phase comparator which can be carried out with switches D, allowing the use of the direction and torque/speed information signal (6) with a variable duty cycle that can be close to extreme values.

Figure 3:
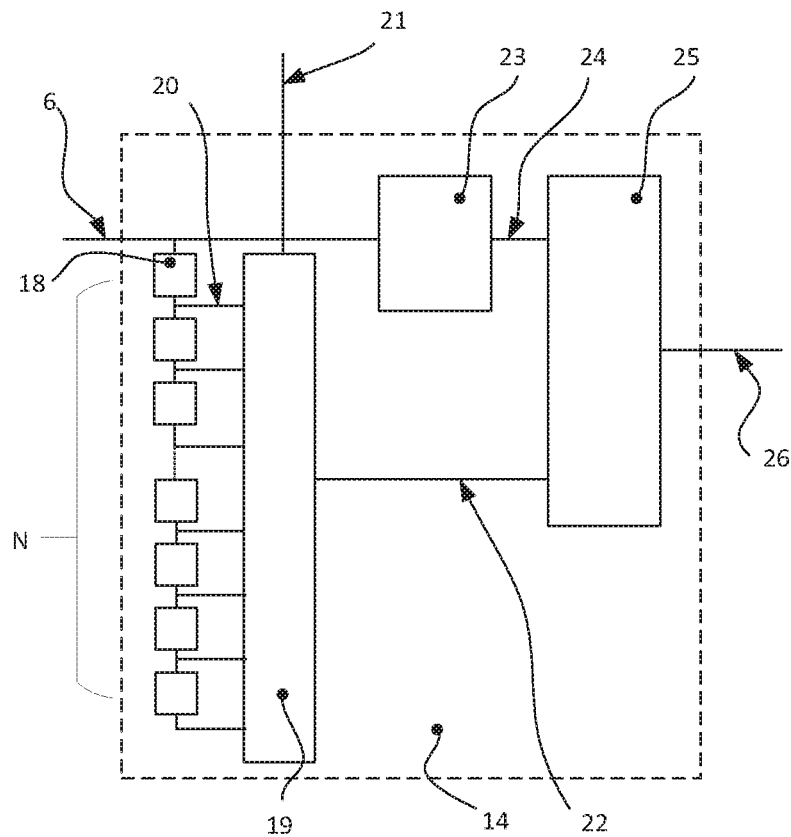
FIG. 3 represents the principle diagram of a first embodiment of the frequency multiplication unit module according to the invention.

FIG. 3 shows a second example of embodiment of the frequency multiplier (14) with 7 elementary modules (18), allowing each stage to multiply the frequency of its input signal and to transmit said multiplied signal with a duty cycle set at a value, typically 50%, to a multiplexer (19) allowing the control voltage (21) to select the input signal, for example (20), to be transmitted to the output of the multiplexer (22). It also consists of a module (23) for extracting the duty cycle of the direction and torque/speed information signal (6), transmitting the duty cycle information (24) in the correct format (e.g. analog) to the high frequency PWM signal generation module (25), the latter combining the new high frequency output from the multiplexer (22) with the duty cycle (24) on the high-frequency direction and torque/speed information signal (26) of the frequency multiplier (14). The possible multiplication factors are therefore XN, where "N" is the number of integrated frequency multiplier elementary modules (18).

As an example may be cited the frequency multiplication required for the application of camshaft phasing units (eVCP), for which 7 elementary frequency multiplier modules (18) with a factor X=2 are sufficient to multiply an input frequency of the direction and torque/speed information signal (6) of 200 Hz with a factor of 128, in order to d'obtain an output signal from the multiplexer (22) in the order of 25,600 Hz. The frequency of this multiplexer output signal (22) is directly transposed to the high-frequency direction and torque/speed information signal (26) of the frequency multiplier module (14) and can be adjusted via the control voltage (21) to optimize the control frequency of the transistors composing the power bridge (13), the latter being the image of the frequency of the output signal (26) of the frequency multiplier. Optimizing the frequency of the multiplier output signal (26) has the effect of reducing the switching losses in the said bridge while ensuring that the transistors are controlled at a frequency beyond the audible frequency bandwidth.

Figure 4:
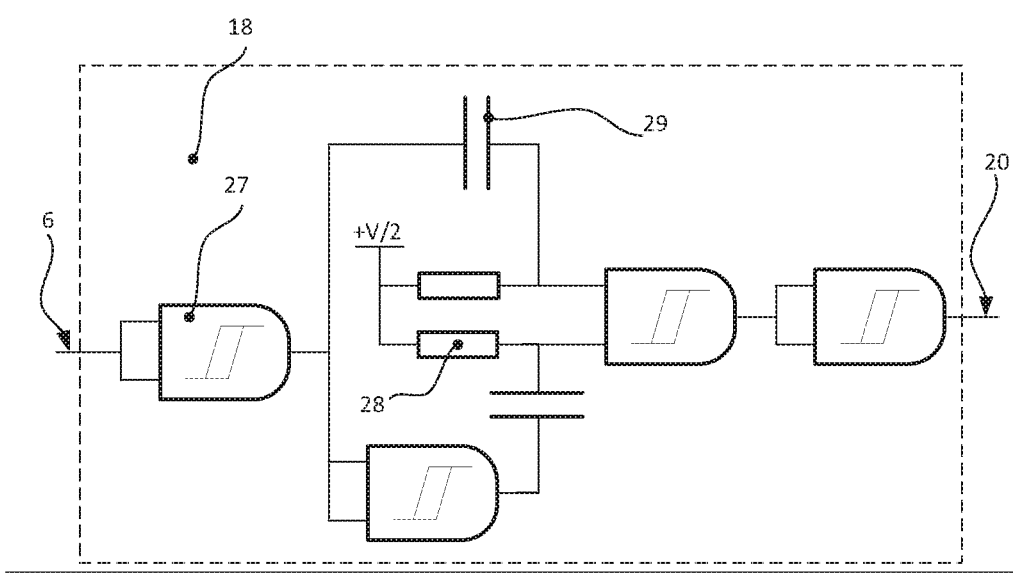
FIG. 4 shows the principle diagram of a second embodiment of the frequency multiplication module according to the invention.

FIG. 4 shows the principle diagram of a solution for providing the elementary module (18) allowing to multiply the frequency of a rectangular direction and torque/speed information signal (6) by a factor X=2 based on NON-OR logic gates (also called NOR) (27), resistors (28) and capacities (29) of low values.

Detailed Description of the Modulation of the Rotation Direction Feedback Information and the Speed Information (or Relative Position)

The following description concerns a particular embodiment, relating to the modulation of the direction of rotation information and the speed information (or relative position) of the BLDC motor (8), compatible with any motor control solution implemented by hardware BLDCs without ECU, software or memory. Conventionally, the rotation direction information is referred to as "direction information", or "direction".

In the case of an application with a servo-control of the BLDC motor (8) of the mechatronic assembly (2) by the electronic control unit (1) integrating a regulator, for example of the proportional type, and a "PI" integrator, it is possible to couple to the driving electronic circuit (10) an electronic modulation circuit (15) measuring the rotational speed, detecting the direction of rotation of the BLDC motor (8) and modulating these two signals in order to provide a single unidirectional digital electrical signal information (17) encoded via the connection interface (3). Such means may be arranged as indicated in FIG. 1.

Figure 5:
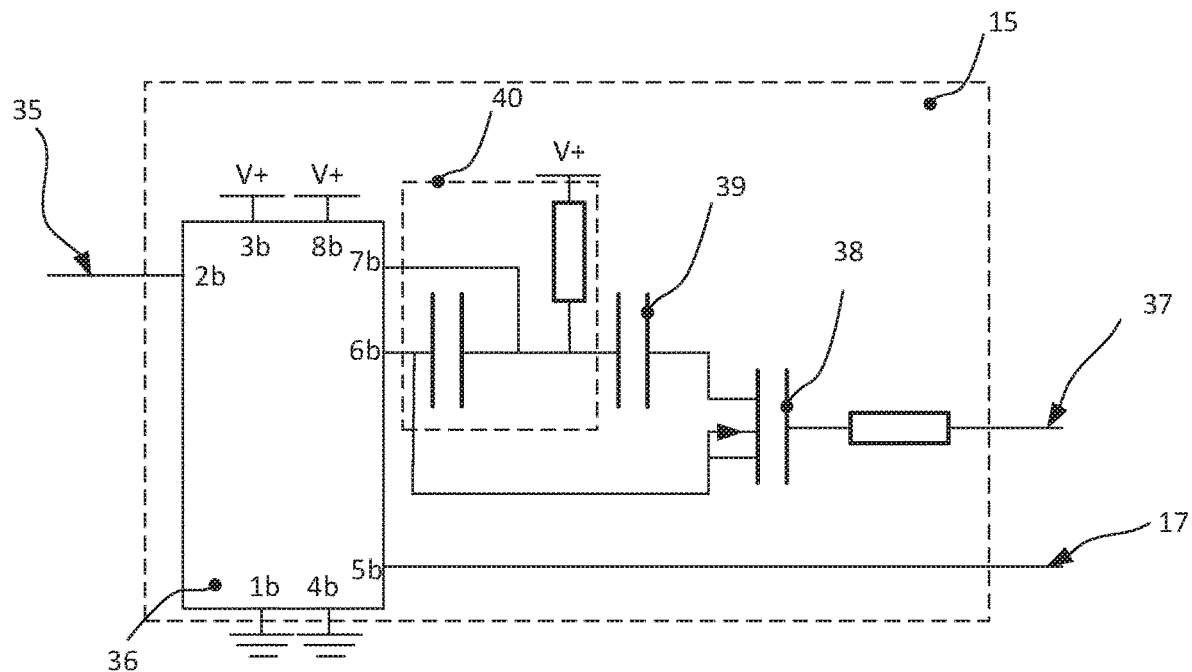
FIG. 5 shows, as an example, the principle diagram of the circuit generating the direction and speed signals.

FIG. 5 is a hardware solution without software, ECU and memory for pulse width modulation of the BLDC motor speed and direction of rotation signals (8). The purpose of digital modulations of the MLI type is to ensure a maximum bit rate of data, with an acceptable error rate by the protocols and the upstream corrector. In the stacking of OSI protocols (standard architecture of digital telecommunications), modulation is the main element of the physical layer. Thus, during the rising edges of the speed signal (35), which is in the form of a digital slot signal with a duty cycle of 50%, a pulse is generated on the unidirectional digital electrical signal (17), whose duration is constant and independent of the frequency of the speed signal (35), considered as the carrier frequency of the modulation. This pulse can be implemented with a monostable flip-flop (36). The monostable chosen in this example is SN74LVC1G123 or 74LVC1G1236-Q100. The pulse duration is imposed by the time constant of the RC filter (40) placed externally and connected to pins 6b and 7b. When the direction signal (37) is 0 (counter-clockwise), the MOSFET (38) is not passing, so the time base of the monostable is only a function of the RC circuit (40). When the direction signal (37) is 1 (clockwise), the MOSFET (38) leads adding the capacity (39) to the RC module (40); the total capacity increases the time constant and thus increases the TON pulse duration. Pin 6b of the monostable must be connected to the ground for correct MOSFET switching, which is the case on the selected monostable. This type of electronic modulation circuit (15) allows to synchronize the direction change information (37) with the speed information (35), used as the carrier frequency.

Figure 6:
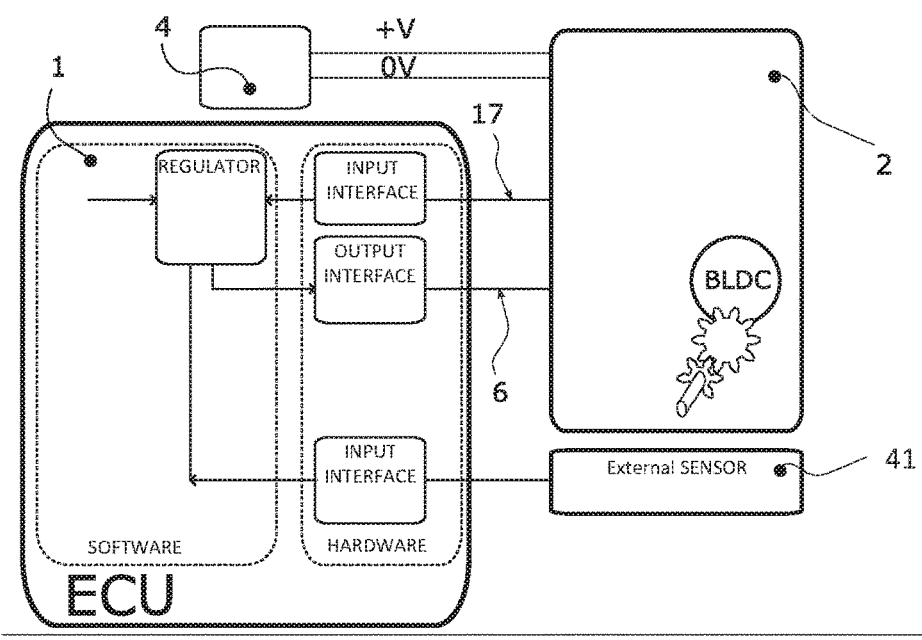

FIG. 6 illustrates the hardware compatibility of a mechatronic assembly (2) integrating an electronic modulation circuit (15) for modulating speed (35) and direction (37) information into a single unidirectional digital electrical signal (17) and an existing electronic control unit (1) not requiring direction information, since the latter receives this information from a sensor (41) external to the described system, or because the direction is never reversed when the assembly is used in the application (operation of an electric pump for example). In this case, the speed information contained in the signal (17) is extracted by the electronic control unit (1) without any hardware or software adaptation of the latter, the direction information is simply ignored and has no effect. The electronic control unit (1) can know the speed of the BLDC motor by measuring the period between each rising edge of the signal (17). The direction information contained by measuring the high state of the signal (17) is not demodulated and is therefore invisible or transparent to the electronic control unit (1) that manages the signal (17) as a square digital signal with a 50% duty cycle.

FIGS. 7 and 8 illustrate the hardware compatibility of a mechatronic assembly (2) integrating an electronic modulation circuit (15) for modulating speed (35) and direction (37) information into a single signal (17) and an existing electronic control unit (1) requiring both speed and direction signals to correctly control the BLDC motor (8). FIG. 7, the direction and speed information must be understandable for the electronic control unit (1) with a software adaptation only, without any hardware adaptation of the input interface. In this case, the signal (17) will be demodulated and decoded in the new software function integrated in the electronic control unit (1), in a preferential but not restrictive way by generating an interruption on each rising edge of the signal (17) triggering an internal counter with a low period. At each counter increment, the signal level (17) is checked to allow the pulse duration to be measured in the high state, since it contains the direction information. The counter increment is stopped and the value read at the next interruption related to the next rising edge of the signal (17); this allows the period of the signal (17) to be known, and hence the rotation speed information of the motor (8). Then, the counter is reset and the described cycle is repeated.

In FIG. 8, the direction and speed information must be understandable for the electronic control unit (1) with hardware adaptation only. In this case, the signal (17) will be demodulated and decoded by an additional module (42) to be added in the electronic control unit (1) to extract the direction information (which can be implemented with one or more comparators based on operational amplifiers with different thresholds to detect both directions) and the speed information (which can be implemented with a circuit transforming a digital signal frequency into a variable voltage analog signal, such as the LM2907 circuit).

Another type of architecture is the demodulation and decoding of the signal (17) by combining software and hardware solutions. FIG. 9 illustrates the pulse-width modulation solution performed by the electronic modulation circuit (15) during a change of direction. The frequency of the modulated signal (17) keeps the same electrical period as the speed information (35) even during the acceleration and deceleration phases. The rising edges of the modulated signal (17) are synchronous with the rising edges of the speed signal (35). This allows to show that the speed information is identical for the electronic control unit (1) if it meets the condition of taking into account only one type of transition (preferably the rising edge for a recessive level of the zero voltage signal) to determine the speed image. The duty cycle of the modulated signal (17) shown in FIG. 9, and expressed in % and noted $R_{17}$, can take two distinct values defined by the direction of rotation of the motor (also called direction information). These two duty cycle values will be different enough to avoid any errors. For example, for the so-called counter-clockwise direction, the duty cycle of the modulated signal (17) will be in a high state for 25% of the electrical period, i. e. $R_{17}$=25% and for the so-called clockwise direction, the duty cycle of the modulated signal (17) will be in a high state for 75% of the electrical period, i.e. $R_{17}$=75%. It is possible to configure the modulated signal (17) by a set of simple and cheap passive components to determine the ratio between the electrical frequency of the signal (17) equal, by default, to ½ of the frequency of a phaser given by the Hall elements (11), depending on the number of phases and the number of rotor poles and the mechanical frequency of the rotor, in case of trapezoidal control. This ratio can be used to divide the frequency of the signals generated by the Hall probes (11), of which the image is the signal (35), in order to have the rotor frequency directly and so the axis of the BLDC motor (8) or the output axis of the mechatronic assembly (2) if it integrates a mechanical reduction stage. FIG. 9 shows the synchronization of speed and direction change information. According to the hardware design of the electronic control circuit (10) supporting the direction determination function and generating the signal (37), a non-deterministic delay exists, which makes possible the signal (37) state to be changed randomly during an electrical period of the signal (35), i. e. during one of the six electrical steps of the BLDC motor (8), in case of trapezoidal control, defined by the hatched area. However, the direction change information is transmitted to the electronic control unit (1) synchronously through the change in duty cycle of the signal (17) over the next electrical period (i. e. from the first electrical step of the rotor in the new direction of rotation). This resynchronization makes it possible to render negligible any error in the interpretation of speed information (or relative position), especially for applications with very high dynamics where the change of direction is very fast. This solution allows, for a very low cost, to:

reduce the size of the connector by removing an electrical connection, remove a signal wire on the wiring harness, improve the robustness of the interpretation of the speed (35) (or absolute position) and direction (37) information by the electronic control unit (1) during a change in the rotation direction, remain compatible with existing ECU hardware architectures (1), demodulate the signal (17) by using an existing software function in the controllers (1) and commonly using to check the control signals of OC brush motors (in the case of use of PWM modulation), provide the opportunity to multiply the usable duty cycles of the modulated signal (17) in order to transmit to the controller errors internal to the mechatronic assembly (2), or any other type of information or diagnosis.

Figure 10:
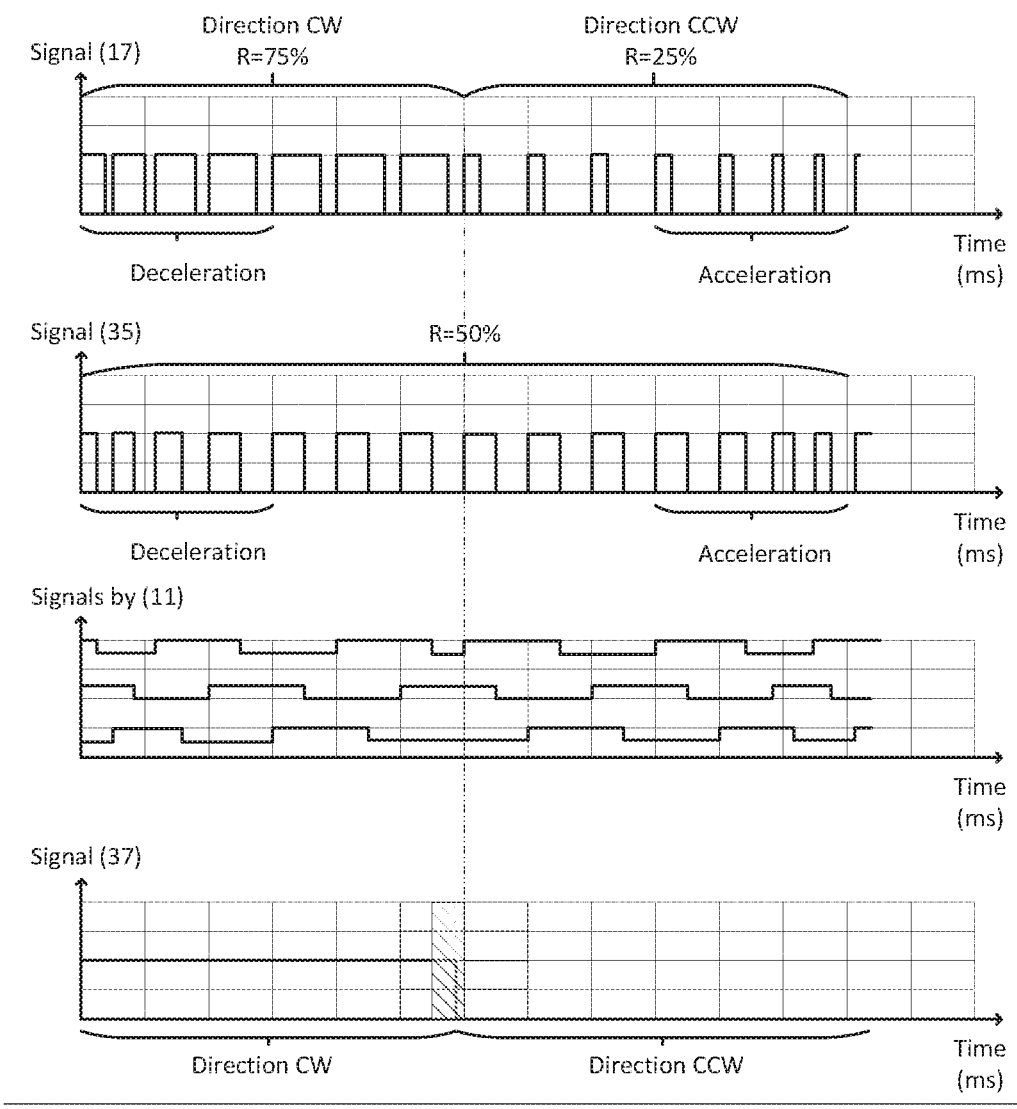
FIG. 10 represents an alternative embodiment of the modulation of the direction and speed information returned by the mechatronic assembly to the controller, allowing the application to be controlled.

FIG. 10 represents the solution consisting in modulating the amplitude of the signal (17). The general principles are common to the pulse width modulation solution, except that the duty cycle of the modulated signal $R_{17}$ is fixed, preferably equal to 50%. The modulated signal (17) is synchronous with the speed signal (35). The amplitude of the modulated signal (17) expressed in volts can take two values forced by the state of the direction information (37). These two amplitude values shall be sufficiently different to avoid any reading error by the electronic control unit (1). As an example, for the anti-clockwise direction, the amplitude of the modulated signal (17) will be 100% of the supply voltage provided by the power source (4) or +V; for the clockwise direction, the amplitude of the modulated signal (17) will be 50% of the supply voltage provided by the power source (4) or (+V)/2.

Detailed Description for Managing the Energy Transmitted to the Motor

Figure 11:
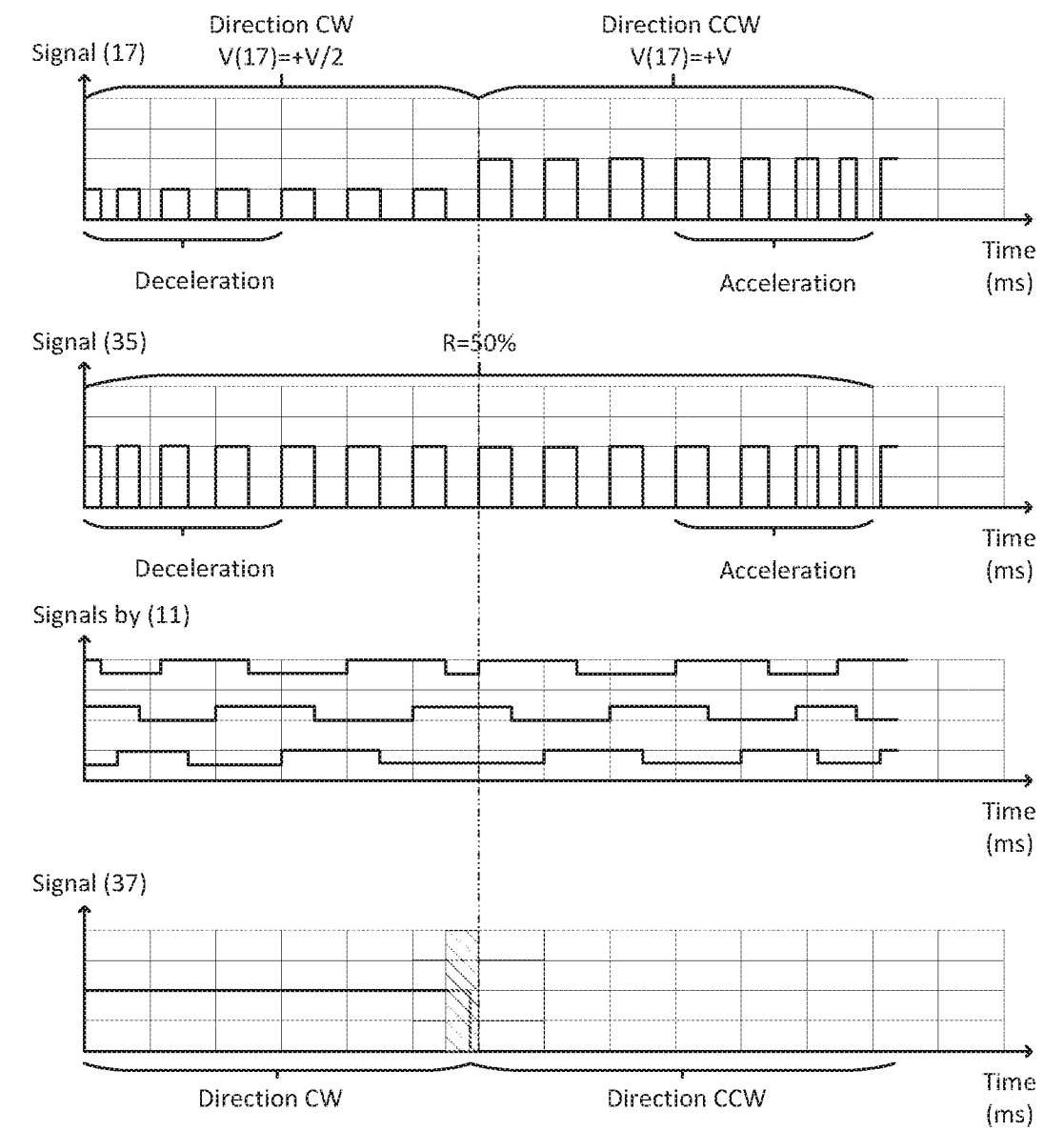
FIG. 11 shows the state of the art of the BLDC motor speed curve as a function of the PWM control signal duty cycle.

FIG. 11 illustrates both bridge control strategies conventionally implemented in electronic driver circuits, or "drivers" (10) in the prior art to drive a mechatronic assembly (2) depending on the control strategies of the controllers (1) through a pulse width modulated direction and torque/speed information signal (6). In the case of slow decay type control, to the left of FIG. 11, the duty cycle $R_6$ of the signal (6) is proportionately carried forward by the electronic driver circuit (10), with a unitary gain on the control signals of the transistors of the power bridge (13) and allows a voltage control of the BLDC motor (8) to be performed. Thus, the duty cycle, noted $R_{MOSFET}$, applied to a part of the power bridge transistors, is equal to the duty cycle $R_6$ of the direction and torque/speed information signal (6), i.e.: $R_{MOSFET}=R_6$.

Figure 12:
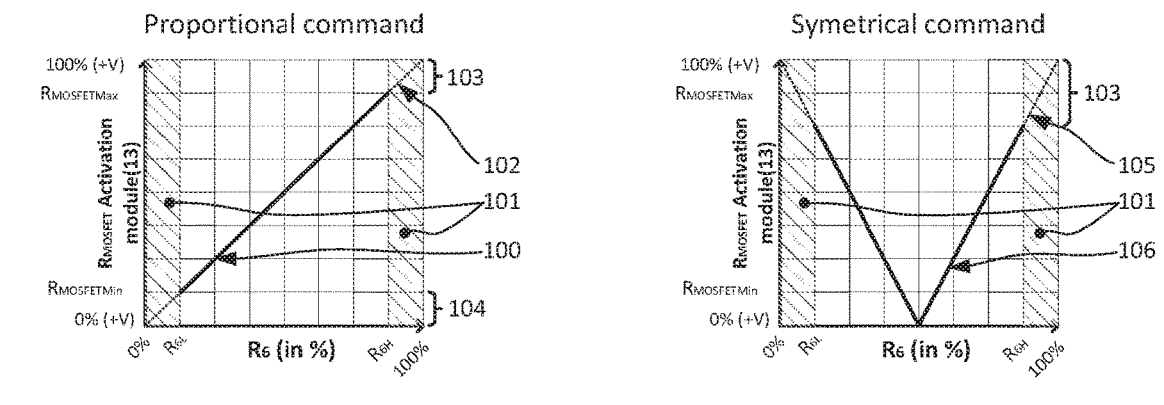
FIG. 12 shows the torque curve of the BLDC motor as a function of the duty cycle of the PWM control signal.
Figure 12:
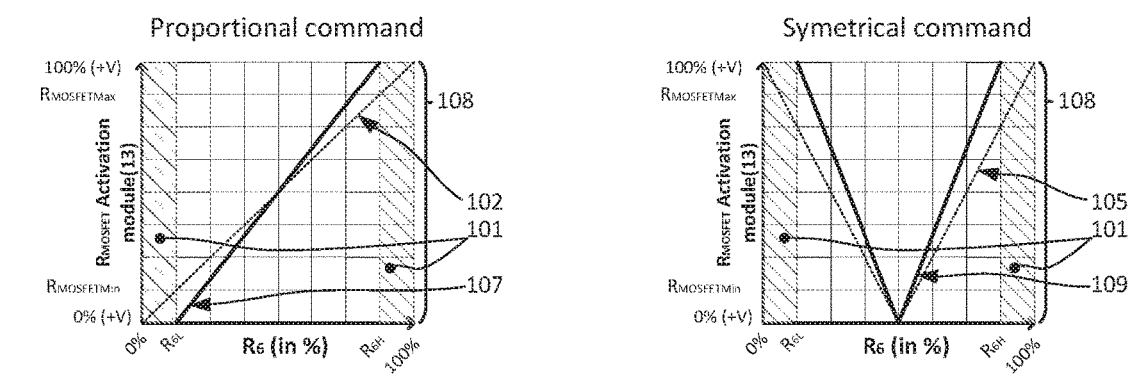
Figure 13:
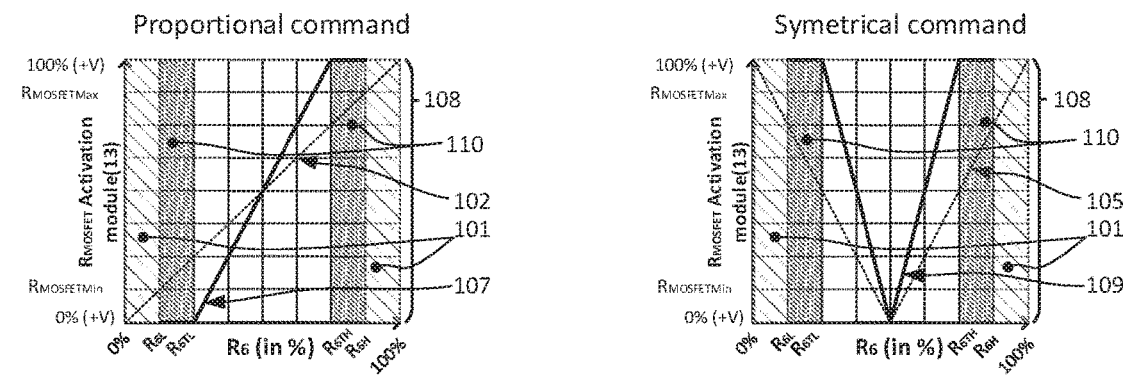
FIG. 13 represents another alternative to the BLDC motor torque curve as a function of the duty cycle of the PWM control signal.

In the case of a synchronous type control, to the right of FIG. 12, the duty cycle $R_6$ of the direction and torque/speed information signal (6) is carried forward symmetrically by the electronic driver circuit (10), with a unitary gain on the control signals of the transistors of the power bridge (13) and allows a voltage control of the BLDG motor (8) to be performed. $R_{MOSFET}=|2\times(R_6-50)|$. In the case of a synchronous type control, the reverse duty cycle, $\overline{R_{MOSFET}}=1/R_{MOSFET}$ is applied to the transistors of the opposite cell. The protection of the application from any electrical defects which may occur on the direction and torque/speed information line (6) between the electronic control unit (1) and the connector (3) imposes the providing of two zones (101), so-called "dead zones", which are not usable by the electronic control unit (1) to drive the mechatronic assembly (2). Both zones (101) allow the electronic control unit (1) and/or the mechatronic assembly (2) to detect short-circuits in the direction and torque/speed information line (6) to the ground (noted 0V) or to the power supply (noted +V), as well as a cutoff of this direction and torque/speed information line (6).

In the case of a so-called proportional control, the electronic control unit (1) generates a direction and torque/speed information signal (6) on the range (100), characterized in that the energy transmitted to the motor is directly proportional to the duty cycle of the direction and torque/speed information signal (6); the first unusable zone (101), having as upper limit the minimal duty cycle $R_{6L}$ that the electronic control unit (1) is able to transmit, makes it impossible for the power bridge (13) to control the BLDC motor (8) with RMS voltage over the whole theoretical range (102), i.e. With effective voltage values comprised between $R_{MOSFETMin}=R_{6L}\times(+V)$ et (0V) and defined by the range (104). The unusable zone (104), delimited by the minimum duty cycle $R_{6L}$, in the case of a so-called proportional control for the control of the mechatronic assembly (2) does not allow to transmit little energy to the BLDC motor, which can be problematic for valve control applications with low friction, in order to prevent any static error of the servo system. The second unusable zone (101), having as its lower limit the maximum duty cycle $R_{6H}$ that can be transmitted by the electronic control unit (1), makes it impossible for the power bridge (13) to control the BLDC motor (8) with voltage RMS values between $R_{MOSFETMax}=R_{6H}\times(+V)$ and (+V) and defined by the range (103).

In the case of a so-called symmetrical control (or synchronous control), the electronic control unit (1) generates a direction and torque/speed information signal (6) over the range (106), characterized in that the energy transmitted to the motor is zero for a duty cycle of the direction and torque/speed information signal (6) of 50%; the two unusable zones (101), having as lower limits the duty cycles $R_{6L}$ and $R_{6H}$ that can be transmitted by the electronic control unit (1), induces the impossibility for the power bridge (13) to control the BLDC motor (8) in voltage over the entire theoretical range (105), either with voltage RMS values between $R_{MOSFETMax}=|2\times(R_{6H}-50)|\times(+V)$, $R_{MOSFETMax}=|2\times(R_{6L}-50)|\times(+V)$ and (+V), and defined by the range (103). The unusable zone (103), delimited by the minimum $R_{6L}$ or maximum $R_{6H}$ duty cycles, for the control of the mechatronic assembly (2) intrinsically limits the maximum electrical energy transmissible to the BLDC motor (8).

FIG. 12 illustrates the invention characterized in that the electronic control circuit, (10), controls the transistors composing the power bridge (13) with a $R_{MOSFET}$ duty cycle as a function of the duty cycle values of the direction and torque/speed information signal (6), noted $R_6$, by following the following formulas. For a so-called proportional control, on the left in FIG. 12:

$$R_{MOSFET} = R_6 \times \frac{100}{R_{6H} - R_{6L}} + \left(100 - \frac{100}{R_{6H} - R_{6L}} \times R_{6H}\right)$$

Curve (107) illustrates this equation.
For a so-called symmetrical control, on the right in FIG. 12:

$$\text{For } R_6 < 50\% : R_{MOSFET} = -\left(R_6 \times \frac{100}{50 - R_{6L}}\right) + \left(100 + \frac{100}{50 - R_{6L}} \times R_{6L}\right)$$

$$\text{For } R_6 \geq 50\% : R_{MOSFET} = R_6 \times \frac{100}{R_{6H} - 50} + \left(100 + \frac{100}{R_{6H} - 50} \times R_{6H}\right)$$

Curve (109) illustrates this equation.

The direction and torque/speed information signal (6) generated by the electronic control unit (1) remains identical to the state of the art, keeping the maximum and minimum duty cycle specifications noted $R_{6L}$ and $R_{6H}$ guaranteeing the detection of electrical defects on the direction and torque/speed information line (6). The electrical energy (108) transmissible to the BLDC motor (8) by the power bridge (13), whose image for trapezoidal voltage control is the duty cycle applied to the +V supply voltage in each of the 6 spatial phasers (for a three-phase motor), is capable of varying between 0%×(+V) and 100%×(+V), eliminating the dead zones (103) and (104) and the disadvantages associated with the latter. For some applications, it is recommended to add zones where 100% of the power will be applied to the motor (zone 110). These zones will be comprised between the $R_{6Th}$ duty cycle and the maximum duty cycle before the upper dead zone $R_{6h}$ as well as the $R_{6TL}$ duty cycle and the minimum duty cycle $R_{6L}$ before the lower dead zone. The application of these zones will ensure that 0% and 100% of the power can be applied without going into the dead zone.

The invention claimed is:

1. A mechatronic assembly for driving a component intended to be connected on one hand to a continuous electrical power source and on another hand to an electronic control unit comprising a computer for executing a servo algorithm delivering a pulse width modulation input signal having discrete states and a duty cycle encoding direction and torque/speed information, the assembly comprising a polyphase brushless electric motor with P phases (where P>1), probes for binary detection of the position of the rotor of the motor, a power bridge for supplying the P phases of the motor, and an on-board electronic control circuit whose output controls the power bridge ensuring self-switching of the motor by combining information from the direction and torque/speed signal, probes for binary detection of the rotor position and a switching logic directly modulating the current of the continuous electrical power source applied to each of the phases of the motor, the direction and torque/speed information provided by the electronic control unit being distinct from the power signal provided only by the power source, a frequency multiplier placed upstream of the electronic control circuit and producing for each discrete state of an input signal $X^N$ discrete states of high frequency direction and torque/speed information having the same duty cycle as the input discrete state, of a duration $X^N$ times shorter than a duration of the discrete state of the input signal, where X and N are integers ≥1, and whose output frequency is greater than or equal to the electrical frequency of space phasers of the controlled motor.

2. The mechatronic assembly according to claim 1, wherein the on-board electronic control circuit is free of microcontroller, computer and memory.

3. The mechatronic assembly according to claim 1, wherein X equals 2.

4. The mechatronic assembly according to claim 1, wherein the frequency multiplier comprises a phase locked loop module.

5. The mechatronic assembly according to claim 1, wherein the frequency multiplier comprises a frequency multiplier electronic circuit composed of N elementary frequency multiplier modules allowing each stage to multiply the frequency of its input signal and to transmit the multiplied signal 26 to the on-board electronic control circuit.

6. The mechatronic assembly according to claim 1, wherein the on-board electronic control circuit includes a modulation electronic circuit that generates a modulated unidirectional digital electrical signal having discrete coded states.

7. The mechatronic assembly according to claim 6, wherein the electronic modulation circuit codes the modulated signal as a function of the direction of the motor.

8. The mechatronic assembly according to claim 7, wherein the electronic modulation circuit modulates the signal in pulse width and encodes the duty cycle of each discrete state.

9. The mechatronic assembly according to claim 7, wherein the electronic modulation circuit modulates the amplitude of the signal and encodes the amplitude of the high level of each discrete state with a fixed duty cycle.

10. The mechatronic assembly according to claim 7, wherein the electronic modulation circuit modulates the frequency of the signal and codes the frequency.

11. The mechatronic assembly according to claim 6, wherein the electronic modulation circuit codes the modulated signal as a function of rotational speed of the motor.

12. The mechatronic assembly according to claim 6, wherein the electronic modulation circuit encodes the amplitude of the high level of each discrete state as a function of a first information, the duty cycle as a function of a second information and the frequency as a function of a third information.

13. The mechatronic assembly according to claim 1, wherein the on-board electronic control circuit includes an impedance adapter that applies a voltage to each of the space phasers according to the duty cycle $$R_{MOSFET} = R_6 \times \frac{100}{R_{6H} - R_{6L}} + \left(100 - \frac{100}{R_{6H} - R_{6L}} \times R_{6H}\right)$$

where $R_6$ denotes the duty cycle of the control signal from the external controller, $R_{6H}$ refers to the upper limit of the duty cycle that can be transmitted by the external controller, $R_{6L}$ refers to the lower limit of the duty cycle that can be transmitted by the external controller.

14. The mechatronic assembly according to claim 13, wherein the ECU control unit determines a duty cycle $R_6$ less than $R_{6L}$ or greater than $R_{6H}$ to control a protection mode.

15. The mechatronic assembly according to claim 1, wherein the on-board electronic control circuit includes an impedance adapter which applies a voltage to each of the space phasers according to the duty cycle $$R_{MOSFET} = -\left(R_6 \times \frac{100}{50 - R_{6L}}\right) + \left(100 + \frac{100}{50 - R_{6L}} \times R_{6L}\right)$$

when $R_6$ is less than 50% and $$= R_6 \times \frac{100}{R_{6H} - 50} + \left(100 - \frac{100}{R_{6H} - 50} \times R_{6H}\right)$$

when $R_6$ is greater than or equal to 50%; or $R_6$ denotes the duty cycle of the control signal from the external controller, $R_{6H}$ refers to the upper limit of the duty cycle that can be transmitted by the external controller, $R_{6L}$ refers to the lower limit of the duty cycle that can be transmitted by the external controller.

16. The mechatronic assembly according to claim 15, wherein the ECU control unit determines a duty cycle $R_6$ less than $R_{6L}$ or greater than $R_{6H}$ to control a protection mode.

17. Mechatronic assembly according to claim 1, wherein N varies according to engine speed.

* * * * *